United States Patent
Hultin Stigenberg et al.

(10) Patent No.: US 7,147,932 B2
(45) Date of Patent: *Dec. 12, 2006

(54) METAL STRIP PRODUCT

(75) Inventors: Anna Hultin Stigenberg, Sandivken (SE); Mikael Schuisky, Sandviken (SE)

(73) Assignee: Sandvik Intellectual Property AB, Sandviken (SE)

( * ) Notice: Subject to any disclaimer, the term of this patent is extended or adjusted under 35 U.S.C. 154(b) by 0 days.

This patent is subject to a terminal disclaimer.

(21) Appl. No.: 10/915,513

(22) Filed: Aug. 11, 2004

(65) Prior Publication Data

US 2005/0064215 A1 Mar. 24, 2005

(30) Foreign Application Priority Data

Aug. 12, 2003 (SE) .................................. 0302207

(51) Int. Cl.
- *B32B 15/01* (2006.01)
- *B32B 15/18* (2006.01)
- *B21K 11/00* (2006.01)
- *C21D 1/18* (2006.01)
- *C25D 11/38* (2006.01)

(52) U.S. Cl. ...................... 428/615; 428/622; 428/623; 428/666; 428/667; 427/528; 427/529; 427/530; 427/585

(58) Field of Classification Search ................ 428/615, 428/622, 627, 633, 667; 427/529, 530, 528, 427/585

See application file for complete search history.

(56) References Cited

U.S. PATENT DOCUMENTS

| | | | |
|---|---|---|---|
| 3,562,140 A | 2/1971 | Skinner et al. | |
| 3,632,494 A | 1/1972 | Herte et al. | |
| 3,976,555 A | 8/1976 | Von Hartel | |
| 4,940,638 A * | 7/1990 | Adaniya et al. | ............. 428/648 |
| 5,021,102 A * | 6/1991 | Harreither | .................... 148/518 |
| 5,741,404 A | 4/1998 | Cathey | |
| 5,842,387 A * | 12/1998 | Marcus et al. | ............. 76/104.1 |
| 6,063,436 A | 5/2000 | Pavell et al. | |
| 6,096,180 A | 8/2000 | Sichmann | |
| 6,238,778 B1 * | 5/2001 | Schneider | .................... 428/209 |
| 6,284,356 B1 * | 9/2001 | Kiriyama | .................... 428/698 |
| 6,431,066 B1 | 8/2002 | Perez et al. | |
| 2004/0118347 A1 * | 6/2004 | Groves et al. | ........ 118/723 EB |
| 2004/0197581 A1 | 10/2004 | Berglund | |

FOREIGN PATENT DOCUMENTS

DE 199 32 444 2/2001

(Continued)

OTHER PUBLICATIONS

Hultin Stigenberg et al., U.S. Appl. No. 10/915,508, filed Aug. 11, 2004, entitled "Metal Strip Product".

*Primary Examiner*—Jennifer C. McNeil
*Assistant Examiner*—Aaron Austin
(74) *Attorney, Agent, or Firm*—Drinker Biddle & Reath LLP

(57) ABSTRACT

A coated steel strip product with a dense and hard abrasion resistant coating on one side or both sides of said strip. The thickness of said coating is in total maximally 25 μm, the hardness of said coating is at least 600 HV and the tensile strength of the steel strip substrate is at least 1200 MPa. The coating is preferably applied by electron beam evaporation and the coating may be, e.g., of $Al_2O_3$. The coated metal strip is useful for the manufacturing of doctor and coater blades for paper and printing industry.

12 Claims, 2 Drawing Sheets

FOREIGN PATENT DOCUMENTS

| | | |
|---|---|---|
| EP | 0 243 556 | 11/1987 |
| EP | 0 758 026 B1 | 11/2001 |
| JP | 63-20447 | 1/1988 |
| WO | 93/07303 A1 | 4/1993 |
| WO | 99/54520 A1 | 10/1999 |
| WO | WO 99/64674 | 12/1999 |
| WO | 02/46526 A1 | 6/2002 |
| WO | WO 02/091461 | 11/2002 |

* cited by examiner

US 7,147,932 B2

METAL STRIP PRODUCT

RELATED APPLICATION DATA

This application is based on and claims priority under 37 U.S.C. §119 to Swedish Application No. 0302207-6, filed Aug. 12, 2003, the entire contents of which are incorporated herein by reference.

FIELD OF THE DISCLOSURE

The present disclosure relates to a coated steel strip material with a very hard and dense coating. It also relates to a method of manufacturing such a coated steel strip in a continuous roll-to-roll process which results in a very good adhesion of a hard and dense coating on a metal strip substrate. In particular, it relates to coated steel strips, which have such a good adhesion of the hard coating that they are suitable for use in coater and doctor blade applications.

STATE OF THE ART

In the discussion of the state of the art that follows, reference is made to certain structures and/or methods. However, the following references should not be construed as an admission that these structures and/or methods constitute prior art. Applicant expressly reserves the right to demonstrate that such structures and/or methods do not qualify as prior art against the present invention.

Doctor and coater blades are used in the manufacturing of paper and in the printing industry, in order to scrape paper and printing ink, respectively, from a rotating roll. In connection to this, problems often arise with wear on the roll and on the coater or doctor blade. Coater and doctor blades are normally manufactured from hardened steel strips. One common way of reducing the wear problem is to apply an abrasion resistant coating to the steel blade after it has been manufactured to its final geometry in the form of a coater or doctor blade. In connection to this, usually a nickel layer must be applied to act as a bond-coat between the substrate and the abrasion resistant coating.

Thus, it is known that abrasion resistant coatings can be used, but there are difficulties to find a cost-efficient and environmentally friendly method that can meet the required quality. The cost for a coater or doctor blade with an applied abrasion resistant coating is at present very high. Moreover, the cost for a quality problem occurring during usage in a printing industry or in a paper mill is high. For cost reasons, a continuous roll-to-roll coating process, preferably integrated in the production of the steel strip is therefore preferred. Further, for quality reasons, a dense coating with very good adhesion to the substrate is of advantage. From a cost perspective, it is also a further advantage if there is such a good adhesion of the abrasion resistant coating that there is no need of any separate bond-coat.

The good adhesion of a dense coating is needed for the functional quality of the finished coater or doctor blade. A poor adhesion, or a porous or coarse coating, would cause problems during usage of the coater blade or doctor blade, e.g., that the coating starts to flake off, that grains or small pieces are torn off, or that fissure problems occur. All in all, this is not acceptable from a quality and cost perspective, since this type of problem with a doctor blade would result in bad printing quality, or that many frequent stops would be needed in the paper mill, to replace bad coater blades. In a process industry such as a paper mill, each stop is very costly and must be avoided.

There are several common methods of making a coating and also several different types of coatings that are being used. As examples can be mentioned:

Ceramic coatings, often consisting of $Al_2O_3$ with possible additions of $TiO_2$ and/or $ZrO_2$. This type of coating is normally applied by using a thermal spray method and an example of this method is described in, e.g., U.S. Pat. No. 6,431,066, in which a ceramic coating is applied along one edge of a doctor blade. Another example of a method is described in EP-B-758 026, in which a wear resistant coating is applied along one edge using several coating steps in a rather complicated continuous process including thermal spray. Thermal spray methods have normally some major drawbacks. For example, the formed coating is rough which means that polishing or other further processing must usually be done to the surface after the coating. Also, a thermal spray coating usually includes a high degree of porosity, implying that a thin dense coating normally can not be achieved. Furthermore, the thickness of thermal sprayed coatings is normally rather high. In the case of coater and doctor blades, the thickness of a ceramic coating is often in the range of 20 to 100 μm. During usage, a thick and coarse coating has an increased risk of fissure formation or that grains tear off from the surface. In many cases expensive nickel or nickel alloys must also be used as a bond-coat in order to improve the adhesion of the ceramic coating.

Metallic coatings, often consisting of pure nickel or chromium, or in the form of a compound such as nickel-phosphorus. These types of metallic coatings are normally applied by using a plating method, and especially electrolytic plating. Electrolytic plating methods have some drawbacks, one major drawback being the difficulty to obtain an even thickness and also that the adhesion of the layer can be poor. Also, plating processes are not environmentally friendly; on the contrary, these processes are often causing environmental problems.

Combinations of coatings, such as a nickel coating comprising abrasion resistant particles, e.g., SiC. One example of this method is described in WO 02/46526, in which different layers are applied in a continuous process for electrolytic nickel coatings in several steps and by adding abrasive particles to at least one of these steps. This method also has some drawbacks, in principle the same drawbacks as for electrolytic plating as described above, but also that nickel is used to a large extent as a bond-coat, meaning that the coating is very expensive.

SUMMARY

Therefore, it is a primary object of the present invention to provide a hard and abrasion resistant coated metal strip with improved adhesion between a dense coating and the substrate. A further object of the present invention is to obtain a cost-efficient coating in a continuous roll-to-roll process integrated in the production of a steel strip. Yet another object of the present invention is to provide a coated steel strip product with a dense layer of an abrasion resistant coating, so as to enable the manufacturing of coater and doctor blades of said material. Still another object of the present invention is to provide a method to manufacture a doctor or coater blade directly in connection to a continuous coating in a roll-to-roll process included in a strip production line, without any need of further manufacturing steps in a separate blade manufacturing. A further object of the present invention is to obtain a coating with a thickness as uniform as possible. These and other objects have been surprisingly attained by providing a coated steel product as disclosed herein.

An exemplary embodiment of a coated steel product comprises a steel strip substrate, and a dense and hard abrasion resistant coating on one side or both sides of the strip substrate. The coating is directly applied on to the steel strip substrate, a thickness of the coating is in total maximally 25 μm, a hardness of the coating is at least 600 HV and a tensile strength of the steel strip substrate is at least 1200 MPa.

An exemplary method of manufacturing a coated steel product, the coated steel strip product having a steel strip substrate and a dense and hard abrasion resistant coating on one side or both sides of the strip substrate, wherein the coating is directly applied on to the steel strip substrate, a thickness of the coating is in total maximally 25 μm, a hardness of the coating is at least 600 HV and a tensile strength of the steel strip substrate is at least 1200 MPa, comprises operating a continuous roll-to-roll process of a strip production line at a feed rate of at least 2.5 m/min to feed the strip substrate, removing a thin oxide layer from the strip substrate by ion assisted etching in an etch chamber to form a clean strip substrate, and depositing the coating directly on the cleaned strip substrate by electron beam evaporation, in an electron beam deposition chamber, wherein both the etch chamber and the electron beam deposition chamber are integrated into the continuous roll-to-roll process.

BRIEF DESCRIPTION OF THE DRAWING FIGURES

The following detailed description of preferred embodiments can be read in connection with the accompanying drawings in which like numerals designate like elements and in which.

DETAILED DESCRIPTION OF PREFERRED EMBODIMENTS

Figures 1, 2:
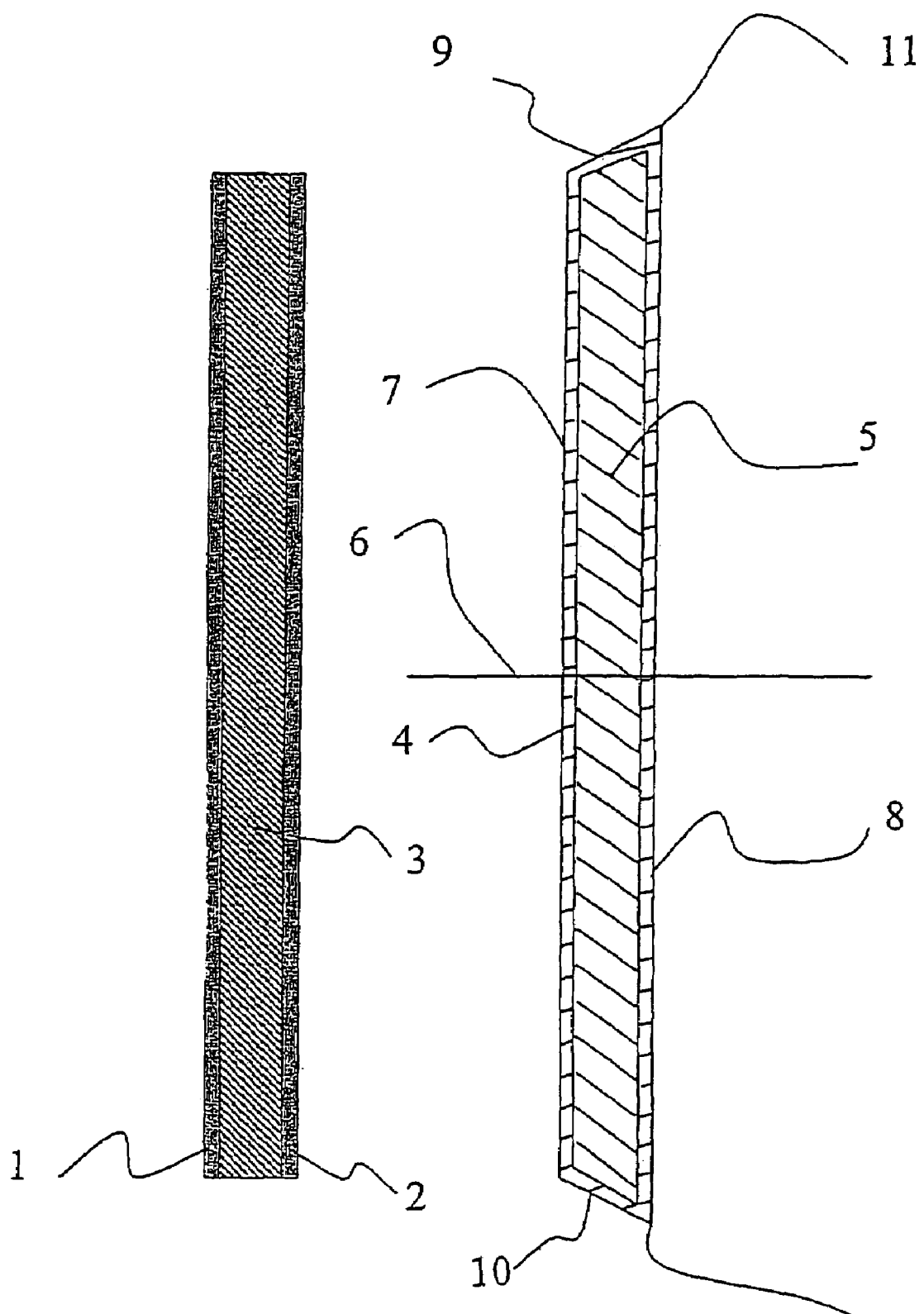
FIG. 1 shows a schematic cross-section of a metal strip according to one embodiment of the invention.
FIG. 2 shows a schematic cross-section of a metal strip according to a second embodiment of the invention.

The final product, in the form of a hardenable strip steel with a coating of a dense and hard abrasion resistant coating, is suitable in doctor and coater blade applications, such as doctor blades for rotogravure or flexogravure printing, or coater blades for scraping paper in the manufacturing of paper, or creping blades for use in creping of paper in the manufacturing of paper. These are all applications in which wear often arises on the blades, wear originating from the contact with the rolls or wear coming from the paper, which contains abrasive minerals. A suitable coating has a dense layer of an abrasion resistant coating with good adhesion, which is hard but also tough enough to withstand the work-load and pressure during usage, with a reduced or no tendency to brittleness or tearing off.

To reduce or eliminate wear on the end product, it is suitable to have the product coated with at least one layer of abrasion resistant coating. Both one-sided and two-sided coatings can be used. One-sided coatings are preferable from a cost perspective, and are preferred in the doctor blade application for use in flexogravure printing, where the one-sided coating will normally stand the lifetime needed. For blade applications used in more severe conditions, or during longer running times, two-sided coatings may be preferable. Otherwise, problems may occur with, e.g., plastic deformation along the edge on the uncoated side, or that there is a material build-up along the edge of the uncoated side, which occasionally may be ripped off from a spot, causing material to locally be torn away from the edge of the coater blade.

The method described herein is suitable for thin coatings of hard and dense abrasion resistant layers in thicknesses on each side up to 25 μm in total, normally up to 20 μm in total, preferably up to 15 μm in total. A maximum 12 μm or preferably maximum 10 μm in total, is preferable from a cost perspective. If thicker coatings are to be coated, an optimum in cost versus properties may be achieved by using multi-layers with up to 10 layers, and where each layer is between 0.1 to 15 μm thick, suitably between 0.1 to 10 μm, or more suitably 0.1 to 7 μm, preferably 0.1 to 5 μm and even more preferably 0.1 to 3 μm.

The coating is performed at a rate of minimum 2.5 meters per minute, preferably min 5 m/min, most preferably min 10 m/min.

The coating should be sufficiently wear-resistant in order to withstand the wear and shear exerted by the treated material, on the other hand it should not be too thick, due to economical reasons and fragility/brittleness. For coater blade and doctor blade applications, the ratio between the thickness of the coating and the substrate material should be between 0.1% to 12%, normally 0.1 to 10% and usually 0.1 to 7.5% but most preferably between 0.1 to 5%.

The abrasion resistance can be achieved by depositing at least one layer of dense oxide coating in the form of $Al_2O_3$, $TiO_2$ or $ZrO_2$, or mixtures of these oxides, preferably a layer of an $Al_2O_3$-based material. Depending on the requirements, an optimum of required hardness and toughness can be achieved by using mixed oxides in the coating. This can be achieved by co-evaporation of aluminum oxide and another selected oxide. Preferably it can be achieved by co-evaporation of aluminum oxide and any other oxide, preferably $TiO_2$ and/or $ZrO_2$. Multi-layers may also be used in order to enable a combination of oxides so as to optimize hardness and toughness by having up to 10 layers with different oxides in the layers.

In variation to the above-described abrasion resistant coating consisting of essentially oxides, also other dense and hard coatings such as metallic coatings can be used in the disclosed embodiments. Hard metallic coatings such as essentially pure Cr may be used if a simple and cheap coating is to be preferred in order to reduce cost as much as possible.

Yet another embodiment uses layers/coatings of transition metal carbides and/or nitrides, such as, e.g., TiN, TiC or CrN, also in some cases in combination with an oxide in the form of $Al_2O_3$, $TiO_2$ or $ZrO_2$, or mixtures of these oxides, preferably an $Al_2O_3$-based material. By using the multi-layer system with up to 10 layers, a coating existing of a combination of several layers of different oxides and nitrides can even further enhance the optimum of desired hardness and toughness.

In order to withstand the wear and shear forces on a coater or a doctor blade, the hardness of the thin coating should be above 600 HV, more suitably above 700 HV, preferably above 800 HV and most preferably above 900 HV.

The tolerances of each layer is maximum +/−10% of the layer thickness at strip widths up to 400 mm. This means that very tight tolerances can be achieved, which is of benefit for the precision during usage and the quality of the product. In comparison to plating or thermal spray this represents much higher tolerances. For instance, in plating there is a so called dog-bone effect, which results in varying thicknesses of the layer. In that case, the layer usually varies more than +/−50% of the layer thickness.

There is no need of any separate bond-coat, but nickel may still be used in one of the layers if it is required from a technical perspective, e.g., to enhance toughness. Since nickel is expensive, it is usually used in very thin layers only, suitably between 0 to 2 μm, preferably between 0 to 1 μm and most preferably between 0 to 0.5 μm. However, any possible nickel layer, it used, would not be the layer adjacent to the substrate.

Description of the substrate material to be coated: The material to be coated should have a good basic mechanical strength, suitable for a coater or doctor blade application. Preferably, it should be a hardenable steel in a hardened and tempered condition, or alternatively a precipitation hardenable steel, such as the alloy disclosed in WO 93/07303, which in the end condition can achieve a tensile strength level above 1200 MPa, or preferably more than 1300 MPa, or at the best above 1400 MPa, or even 1500 MPa.

If the coater or doctor blade is intended for use in a corrosive environment, then the steel alloy should also have a sufficient addition of chromium to enable a good basic corrosion resistance. The Cr content in this case is above 10% by weight, or at least 11%, or preferably a minimum of 12%.

The coating method may be applied on any kind of product made of said type of steel alloy and in the form of a strip that has good hot workability and also can be cold-rolled to thin dimensions. The alloy also typically can be capable of readily being manufactured to coater or doctor blade applications in a manufacturing process including steps such as forming, grinding, shaving, cutting, polishing, stamping, or the like. The thickness of the strip substrate material is usually between 0.015 mm to 5.0 mm and suitably between 0.03 mm to 3 mm. Preferably, it is between 0.03 to 2 mm, and even more preferably between 0.03 to 1.5 mm. The width of the substrate material depends on if the coating is made before or after the slitting operation. Further, said width should preferably be selected to be a width suitable for further manufacturing to the final width of the coater or doctor blade. In principle, the width of the substrate material is therefore between 1 to 1500 mm, suitably 1 to 1000 mm, or preferably 1 to 500 mm, or even more preferably between 5 and 500 mm. The length of the substrate material is suitably between 10 and 20,000 m, preferably between 100 and 20,000 m.

Description of the Coating Method: A variety of physical or chemical vapor deposition methods for the application of the coating media and the coating process may be used as long as they provide a continuous uniform and adherent layer. As exemplary of deposition methods can be mentioned chemical vapor deposition (CVD), metal organic chemical vapor deposition (MOCVD), physical vapor deposition (PVD) such as sputtering and evaporation by resistive heating, by electron beam, by induction, by arc resistance or by laser deposition methods. Electron beam evaporation (EB) is one preferred method for the deposition. Optionally, the EB evaporation can be plasma activated to even further ensure good quality coatings of hard and dense layers.

The coating method is integrated in a roll-to-roll strip production line and the hard coating is then deposited by means of electron beam evaporation (EB) in a roll-to-roll process. If multi-layers are needed, the formation of multi-layers can be achieved by integrating several EB deposition chambers in-line. The deposition of metallic coatings is made under reduced atmosphere at a maximum pressure of $1\times10^{-2}$ mbar with no addition of any reactive gas to promote essentially pure metal films. The deposition of metal oxides is performed under reduced pressure with an addition of an oxygen source as reactive gas in the chamber. A partial pressure of oxygen is in the range 1 to $100\times10^{-4}$ mbar. If other types of coatings are to be achieved, e.g., transition metal carbides and/or nitrides such as TiN, TiC or CrN, or mixtures thereof with, e.g., metal oxides, the conditions during the coating should be adjusted with regard to the partial pressure of a reactive gas so as to enable the formation of the intended compound. In the case of oxygen, a reactive gas such as $H_2O$, $O_2$ or $O_3$, but preferably $O_2$, may be used. In the case of nitrogen, a reactive gas such as $N_2$, $NH_3$ or $N_2H_4$, but preferably $N_2$, may be used. In the case of carbon, any carbon containing gas may be used as reactive gas, for an example $CH_4$, $C_2H_2$ or $C_2H_4$. All these reactive EB evaporation processes may be plasma activated.

To enable a good adhesion, different types of cleaning steps are used. First, the surface of the substrate material is cleaned to remove oil residues, which otherwise may negatively affect the efficiency of the coating process and the adhesion and quality of the coating. Moreover, the very thin native oxide layer that normally is present on a steel surface is removed. This can preferably be done by including a pre-treatment of the surface before the deposition of the coating. In the roll-to-roll production line, the first production step is therefore preferably an ion assisted etching of the metallic strip surface to achieve good adhesion of the first coating [see FIG. 3].

Two exemplary embodiments are now described in more detail. The first exemplary embodiment (FIG. 1) comprises a coating 1,2 for a substrate material 3 in full strip width. The substrate material can be made of different alloys, such as a hardenable carbon steel or a hardenable stainless chromium steel. The other exemplary embodiment (FIG. 2) comprises a coating 4 of a steel strip 5, which before the coating process, has been both slitted and edge treated to a width in principle twice the final width of the coater blade. During coating, both the main sides 7,8 and the narrow lateral sides 9, 10 are coated, thereby obtaining a complete coating around the scraping or cutting edges 11, 12. Suitably, the lateral sides 9 and 10 are coated simultaneously with the somewhat narrower main side 7. The examples given are only intended as illustrative examples and should not serve as a limitation to the present innovation.

The substrate material has a composition suitable for hardening, which means, for example:

Hardenable carbon steel of 0.1–1.5% C, 0.001–4% Cr, 0.01–1.5% Mn, 0.01–1.5% Si, up to 1% Ni, 0.001–0.5% N, rest essentially Fe; or Hardenable chromium steels of 0.1–1.5% C, 10–16% Cr, 0.001–1% Ni, 0.01–1.5% Mn, 0.01–1.5% Si, up to 3% Mo, 0.001–0.5% N, rest essentially Fe; or Precipitation hardenable steels of: 0.001–0.3% C, 10–16% Cr, 4–12% Ni, 0.1–1.5% Ti, 0.01–1.0% Al, 0.01–6% Mo, 0.001–4% Cu, 0.001–0.3% N, 0.01–1.5% Mn, 0.01–1.5% Si, rest essentially Fe.

EXAMPLE 1

The chemical compositions of the substrate materials in the example are according to the internal Sandvik designation 20C2 and 13C26, with essentially the following nominal composition:

Sandvik 20C2: 1.0% C, 1.4% Cr, 0.3% Si and 0.3% Mn (by weight); and

Sandvik 13C26: 0.7% C, 13% Cr, 0.4% Si and 0.7% Mn (by weight).

Firstly, the substrate materials are produced by ordinary metallurgical steelmaking to a chemical composition as described above. After this, they are hot-rolled down to an intermediate size, and thereafter cold-rolled in several steps with a number of recrystallization steps between said rolling steps, until a final thickness of 0.2 mm and a width of maximally 400 mm. Thereafter, the strip steels are hardened and tempered to the desired mechanical strength level, which is preferably at least 1200 MPa. The surface of the substrate material is then cleaned to remove oil residuals from the rolling and hardening operations.

Thereafter, the coating process takes place in a continuous process line, starting with decoiling equipment. The first step in the roll-to-roll process line can be a vacuum chamber or an entrance vacuum lock followed by an etch chamber, in which ion assisted etching takes place in order to remove the thin oxide layer on the substrate material. The strip then enters into the EB evaporation chamber(s) in which deposition of an oxide takes place. In this example, $Al_2O_3$ is selected as the material to be deposited. An oxide layer of normally 0.1 up to 25 µm is deposited; the preferred thickness depends on the application. In the examples described here, a thickness of 2 µm is deposited by using one EB evaporation chamber. After the EB evaporation, the coated strip material passes through the exit vacuum chamber or exit vacuum lock before it is being coiled on to a coiler.

The coated strip material can now, if needed, be further processed by, for an example, slitting and edge treatment, to obtain the preferred final dimension and edge condition for the manufacturing of a coater blade. It is an advantage if an additional coating along the edge of the finished coater blade application can be made in a continuous coating process using EB evaporation, but also other processes may be used. Preferably, an additional coating along the edge of a finished blade is of same type as the coating applied on the strip material.

The end product as described herein, i.e., a coated 20C2 and 13C26-strip material, respectively, in a strip thickness of 0.2 mm and with a thin coating of $Al_2O_3$ of 2 µm, has a very good adhesion of the coated layer and is thus suitable to use especially for the manufacturing of doctor blades for flexogravure or rotogravure printing.

Figure 3:
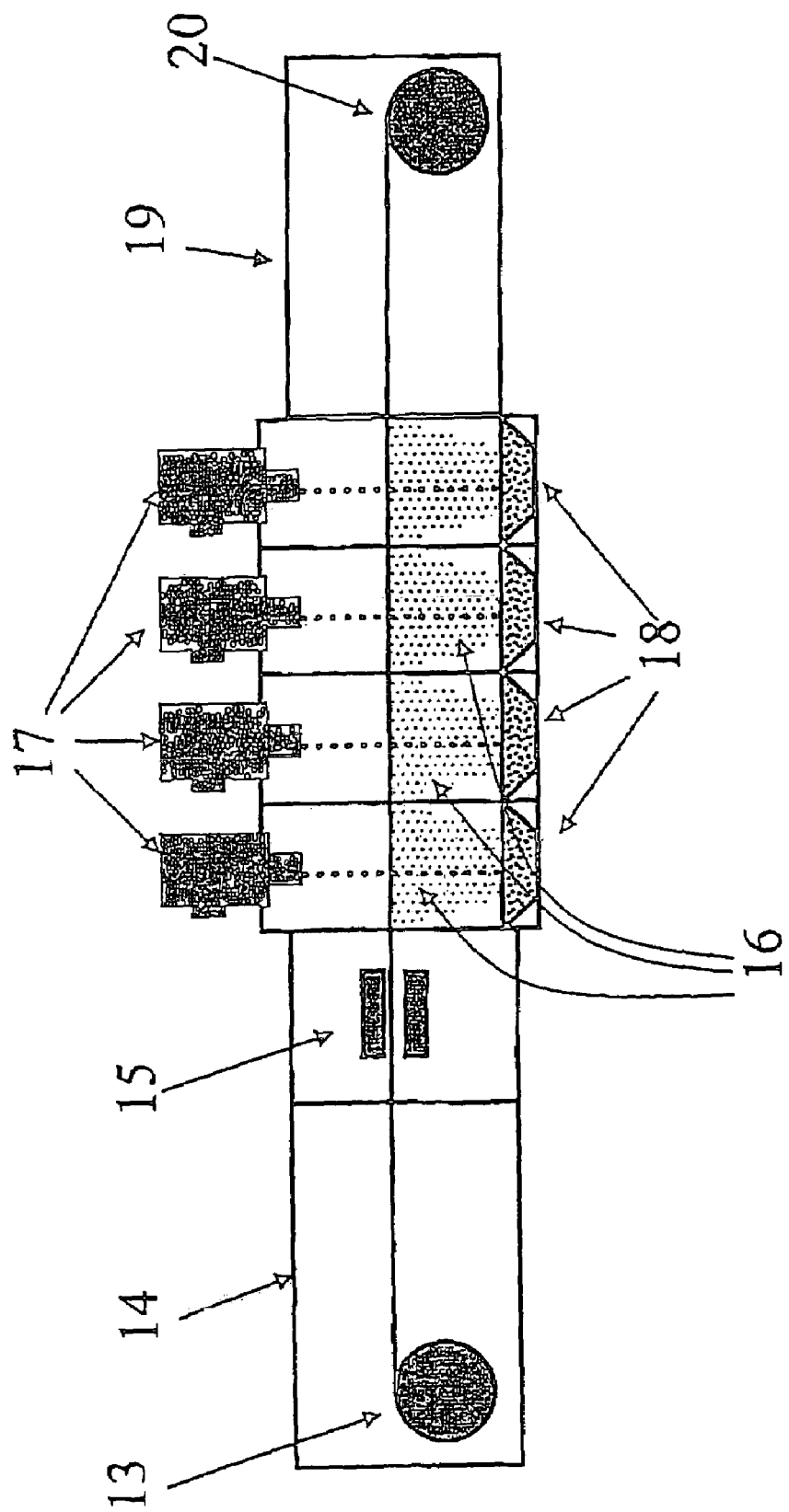
FIG. 3 shows schematically a production line for the manufacturing of a coated metal strip material according to an embodiment of the invention.

The roll-to-roll electron beam evaporation process referred to above is illustrated in FIG. 3. The first part of such a production line is the uncoiler 13 within a vacuum chamber 14, then the in-line ion assisted etching chamber 15, followed by a series of EB evaporation chambers 16. The number of EB evaporation chambers needed can vary from 1 up to 10 chambers to achieve a multi-layered structure, if so desired. All the EB evaporation chambers 16 are equipped with EB guns 17 and water-cooled copper crucibles 18 for the evaporation. After these chambers come the exit vacuum chamber 19 and the recoiler 20 for the coated strip material, the recoiler being located within vacuum chamber 19. The vacuum chambers 14 and 19 may also be replaced by an entrance vacuum lock system and an exit vacuum lock system, respectively. In the latter case, the uncoiler 13 and the coiler 20 are placed in the open air.

EXAMPLE 2

The chemical composition of the substrate material in this example is according to the internal Sandvik designation 20C with essentially the following nominal composition:

Sandvik 20C: 1.0% C, 0.2% Cr, 0.3% Si and 0.4% Mn (by weight).

Firstly, the substrate material is produced by ordinary metallurgical steelmaking to a chemical composition as described above. The material is then hot-rolled down to an intermediate size, and thereafter cold-rolled in several steps with a number of recrystallization steps between said rolling steps, until a final thickness of 0.45 mm and a width of maximum 400 mm are attained. Thereafter, the steel strip is hardened and tempered to the desired mechanical strength level, which is preferably above 1200 MPa. The strip is afterwards slitted to a width corresponding to substantially twice the width of the final blade application. According to this example, the final coater blade width is 100 mm and the strip is thus slitted to a width of between 200 to 250 mm. The edges along the slitted strip are then edge-treated, for example shaved, ground and polished, to the conditions and geometry considered suitable for the intended coater blade application. After this, the strip is submitted to a coating treatment fully analogous to Example 1, cf. also FIG. 3.

The end product will be a coated strip according to FIG. 2, the coating material and thickness being the same as in Example 1. Now, the coated strip material can be slitted in the middle along section 6 to obtain two coated strips, each with the dimension and edge geometry suitable for a finished coater blade. In principle, only cutting into required final length remains.

The end product as described in this example, i.e., a slitted, edge treated and coated strip material, in a strip thickness of 0.45 mm and a final slitted width of 100 mm, has a thin covering aluminum oxide coating of 2 µm with a very good adhesion of the coated layer. This product can be cut into required length, normally in between 3 to 10 m, and then used as a coater blade in a paper mill, without any further processing. It may also, if required, be further processed, e.g., with an additional edge treatment or with additional coatings along the edge, or polishing or the like, in order to meet a specific customer demand. An additional coating along the edge of the finished coater blade application can preferably be made in a continuous coating process using EB evaporation, but also other processes may be used.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A coated steel strip product, comprising:
  a steel strip substrate; and
  a dense and hard abrasion resistant coating on one side or both sides of the strip substrate,
  wherein the coating is directly applied on to the steel strip substrate, a thickness of the coating is in total maximally 25 µm, a hardness of the coating is at least 600 HV and a tensile strength of the steel strip substrate is at least 1200 MPa, and wherein the coating is a metallic coating consisting essentially of Cr.

2. The product according to claim 1, wherein the thickness of the strip substrate is between 0.015 mm and 5.0 mm.

3. The product according to claim 1, wherein the strip substrate is made of hardenable carbon steel, hardenable stainless chromium steel, or precipitation hardenable strip steel.

4. The product according to claim 1, wherein the coating has a multi-layer structure of up to 10 layers.

5. The product according to claim 4, wherein each individual layer of the multi-layer structure has a thickness of between 0.1 to 15 μm.

6. The product according to claim 4, comprising at least one layer of nickel having a thickness up to 2 μm, the at least one layer not being adjacent the strip substrate.

7. A doctor or coater blade, comprising a coated steel strip product as in any one of claims 1, 4 and 6.

8. A doctor or coater blade according to claim 7, wherein a lateral scraping side and/or a cutting side is coated with the same coating composition as a main side.

9. A method of manufacturing a coated steel strip product, the coated steel strip product having a steel strip substrate and a dense and hard abrasion resistant coating on one side or both sides of the strip substrate, wherein the coating is directly applied on to the steel strip substrate, a thickness of the coating is in total maximally 25 μm, a hardness of the coating is at least 600 HV and a tensile strength of the steel strip substrate is at least 1200 MPa, the method comprising:

operating a continuous roll-to-roll process of a strip production line at a feed rate of at least 2.5 m/min to feed the strip substrate, wherein operating includes moving the strip substrate through atmospherically controlled chambers including an etch chamber and an electron beam deposition chamber;

removing a thin oxide layer from the strip substrate by ion assisted etching in the etch chamber to form a clean strip substrate;

depositing the coating directly on the cleaned strip substrate by electron beam evaporation, in the electron beam deposition chamber, wherein both the etch chamber and the electron beam deposition chamber are integrated into the continuous roll-to-roll process; and comprising forming the coated strip substrate into a final dimension by slitting or edge treatment, wherein the coating is a multi-layer coating comprising Cr and the method comprises forming the multi-layer coating by a plurality of depositions by electron beam evaporation.

10. The method according to claim 9, wherein depositing by electron beam evaporation is plasma activated.

11. A doctor or coater blade according to claim 7, wherein a ratio between thickness of the coating and thickness of the strip substrate is between 0.1% to 12%.

12. The method according to claim 9, wherein a variation in the thickness of the coating across the entire width of the strip substrate is maximally ±10% of the thickness of the coating.

* * * * *